United States Patent
Hong et al.

(10) Patent No.: US 7,323,931 B2
(45) Date of Patent: Jan. 29, 2008

(54) SYSTEM AND METHOD FOR OPERATING A FEEDBACK NETWORK

(75) Inventors: Merit Y. Hong, Chandler, AZ (US); Julian G. Aschieri, Tempe, AZ (US); Zhou Zhixu, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 116 days.

(21) Appl. No.: 11/389,223

(22) Filed: Mar. 27, 2006

(65) Prior Publication Data

US 2007/0222510 A1 Sep. 27, 2007

(51) Int. Cl.
*H03F 1/36* (2006.01)

(52) U.S. Cl. .......................... 330/86; 330/307
(58) Field of Classification Search ................ 770/86, 770/69, 307, 252, 259, 260
See application file for complete search history.

(56) References Cited

U.S. PATENT DOCUMENTS

| | | | |
|---|---|---|---|
| 5,243,345 A | 9/1993 | Naus et al. | |
| 6,556,075 B1 * | 4/2003 | Jordan | 330/51 |
| 6,825,717 B2 * | 11/2004 | Dettmann | 330/86 |
| 7,262,655 B2 * | 8/2007 | Mijuskovic | 330/86 |

* cited by examiner

*Primary Examiner*—Henry Choe

(57) ABSTRACT

A method and apparatus are provided for operating a feedback network (300, 400). The method and apparatus operate to combine (240) a feedback signal ($I_F$) and an incoming signal ($V_{IN}$) to generate an adjusted signal ($I_{ADJ}$) at an input node of an amplifier element (110); amplifying the amplifier input signal in the amplifier element to produce an amplifier output signal ($V_{OUT}$) at an output node of the amplifier element; processing the amplifier output signal according to a feedback operation (230) to generate the feedback signal ($I_F$); and providing an assist current (350, 450, $I_{ASSIST}$) to the output node of the amplifier element, separate from an output current provided by the amplifier element.

20 Claims, 4 Drawing Sheets

SYSTEM AND METHOD FOR OPERATING A FEEDBACK NETWORK

FIELD OF THE INVENTION

The present invention relates in general to a system and method for operating a feedback network that includes an amplifier element. In particular it relates to a system and method for providing an external assist current at the output of the amplifier element.

BACKGROUND OF THE INVENTION

Active resistor-capacitor (RC) integration and switched-capacitor integration are both commonly used to process incoming signals in data transmission networks. Each of these integration functions is commonly implemented, in part, using an amplifier with capacitive feedback to perform the integration. One common type of amplifier that is used in such circuits is a transconductance amplifier.

In operation, a transconductance amplifier outputs a current proportional to its input voltage, i.e., $$I_{OUT} = G_M \cdot V_{IN} \qquad (1)$$

where $V_{IN}$ is the input voltage of the amplifier, $I_{OUT}$ is the output current of the amplifier, and $G_M$ is the transconductance of the amplifier.

The transconductance amplifier thus receives the input voltage $V_{IN}$ and then supplies the output current $I_{OUT}$ in proportion to the amplifier's transconductance $G_M$. This means that if the input voltage $V_{IN}$ remains relatively stable, the higher the required output current $I_{OUT}$, the higher the required transconductance $G_M$ for the amplifier.

Ideally, a transconductance amplifier will have zero input current $I_{IN}$, though practically, the input current $I_{IN}$ is simply very small. This small input current $I_{IN}$ passing over the input impedance of the transconductance amplifier can provide the input voltage $V_{IN}$. Similarly, an output voltage $V_{OUT}$ can be obtained by passing the output current $I_{OUT}$ over the output impedance of the transconductance amplifier.

During operation, active-RC integrators and switched-capacitor integrators each impose different amplifier performance criterion on a transconductance amplifier. As a result, where the same transconductance amplifier is used in both active-RC integrator and switched-capacitor integrator circuits, there can be a requirement for a very large transconductance. This is particularly true when a large signal-to-noise-plus-distortion ratio (SNDR) is required for a signal passing through the amplifier.

The signal-to-noise ratio (SNR) of an incoming signal generally indicates the ratio of the received signal power of the incoming signal to the noise power of the incoming signal. It is useful as an indicator of the reliability of the incoming signal. The SNDR for an incoming signal is similar, but indicates the ratio of the signal power of the incoming signal to the received noise-plus-distortion power of the incoming signal. This can be a more useful indicator of the reliability of the incoming signal in cases where distortion is common, such as in modulated audio signals in which distortion can result from a carrier radio frequency.

Increasing the transconductance $G_M$ of a transconductance amplifier can be expensive in terms of money and die space, however. This is particularly true in a CMOS device, for example, which is a commonly-used implementation for amplifiers. One reason for this is that the transconductance $G_M$ of a CMOS amplifier improves in accordance with the square root of the width of the amplifier, i.e., $$G_M \propto \sqrt{W} \qquad (2)$$

where W is the width of the amplifier. Since amplifier width and current passing through are related, this can be extended to say that the transconductance $G_M$ of the CMOS device rises in accordance with the square root of the current passing through the amplifier, i.e., $$G_M \propto \sqrt{I_A} \qquad (3)$$

where $I_A$ is the current passing through the amplifier.

As a greater output current $I_{OUT}$ is required for the amplifier, a correspondingly greater current $I_A$ is required to pass through the amplifier, necessitating an increase in the transconductance $G_M$ of the amplifier. Since space on a CMOS device is extremely valuable, increasing W can significantly increase the cost of the resulting device, or at the very least, decrease the amount of other circuitry allowed to be included in the resulting device. And increasing the amplifier current $I_A$ means greater power consumption, which can increase the battery drain in a portable device.

BRIEF DESCRIPTION OF THE DRAWINGS

The accompanying figures where like reference numerals refer to identical or functionally similar elements and which together with the detailed description below are incorporated in and form part of the specification, serve to further illustrate an exemplary embodiment and to explain various principles and advantages in accordance with the present invention.

DETAILED DESCRIPTION

The instant disclosure is provided to further explain in an enabling fashion the best modes of performing one or more embodiments of the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms such as first and second, and the like, if any, are used solely to distinguish one from another entity, item, or action without necessarily requiring or implying any actual such relationship or order between such entities, items or actions.

It is noted that some embodiments may include a plurality of processes or steps, which can be performed in any order, unless expressly and necessarily limited to a particular order; i.e., processes or steps that are not so limited may be performed in any order.

Much of the inventive functionality and many of the inventive principles when implemented, are best implemented in integrated circuits (ICs), and in particular through the use of circuits involving CMOS transistors. It is expected that one of ordinary skill, notwithstanding possibly significant effort and many design choices motivated by, for example, available time, current technology, and economic considerations, when guided by the concepts and principles disclosed herein will be readily capable of generating such ICs with minimal experimentation. Therefore, in the interest of brevity and minimization of any risk of obscuring the principles and concepts according to the present invention, further discussion of such ICs, if any, will be limited to the essentials with respect to the principles and concepts used by the exemplary embodiments.

Active-RC Integrator

Figure 1:
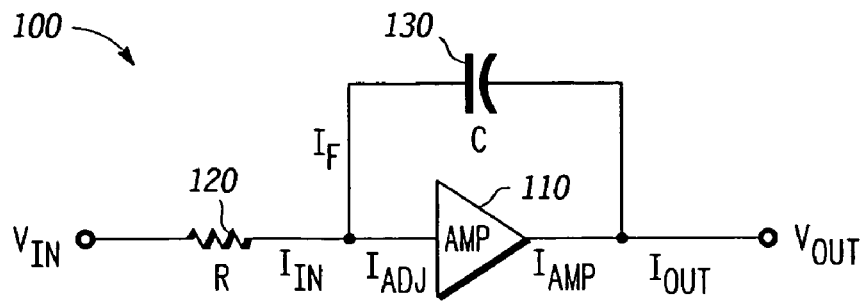
FIG. 1 is a circuit diagram of an active RC integrator.

FIG. 1 is a circuit diagram of an active-RC integrator. An active RC integrator is useful for many different circuits, including those requiring integration or filtering. As shown in FIG. 1, the active-RC integrator 100 includes an amplifier element 110, an input resistor 120, and a feedback capacitor 130.

The amplifier element 110 serves to amplify an amplifier input signal received at its input node in accordance with a gain value of the amplifier. The amplifier could be an operational amplifier or any other suitable amplifier circuit. The amplifier element 110 could be any variety, e.g., voltage, current, transconductance, or transresistance, depending upon the needs of the circuit it is used in. Furthermore, the amplifier element 110 could be single-ended or differential.

The input resistor 120 is connected between the input voltage $V_{IN}$ and the amplifier input node, and operates to provide an input current $I_{IN}$ to the amplifier input node that is proportional to the input voltage, i.e., $$I_{IN} = \frac{V_{IN}}{R} \tag{4}$$

The feedback capacitor 130 is connected between the amplifier output node and the amplifier input node and provides a feedback current $I_F$ that is combined with the input current $I_{IN}$ at the amplifier input node. Because the feedback element in this circuit is a capacitor, the feedback current $I_F$ will flow only when there is a change in the output voltage $V_{OUT}$.

In operation, the active-RC integrator will serve to integrate the input voltage $V_{IN}$. In other words, the output voltage $V_{OUT}$ at any given moment will be the integral of all of the past input voltages $V_{IN}$ since the circuit started operation. During this operation, the amplifier element 110 will have to pass the current ($I_{IN}$–$I_F$), since the circuit uses negative feedback. This quantity can be called the adjusted current $I_{ADJ}$.

If the amplifier element 110 is a transconductance amplifier, the restrictions noted above apply. In other words, the feedback path should provide a feedback current $I_F$ that will be almost equal to the input current $I_{IN}$, thus ensuring that the adjusted current $I_{ADJ}$ provided to the input of the amplifier is nearly zero. Since the output of the amplifier element 110 is the only source for this current, this means that the amplifier element 110 must provide all of the current in its amplifier current $I_{AMP}$.

Although not shown in FIG. 1, an active-RC integrator can be used in conjunction with a switched-capacitor design. In a switched capacitor integrator, switched capacitors are used to simulate one or more required resistors. This is at least in part because capacitors and switching transistors are often less costly than resistors and more easily controlled.

Figure 2:
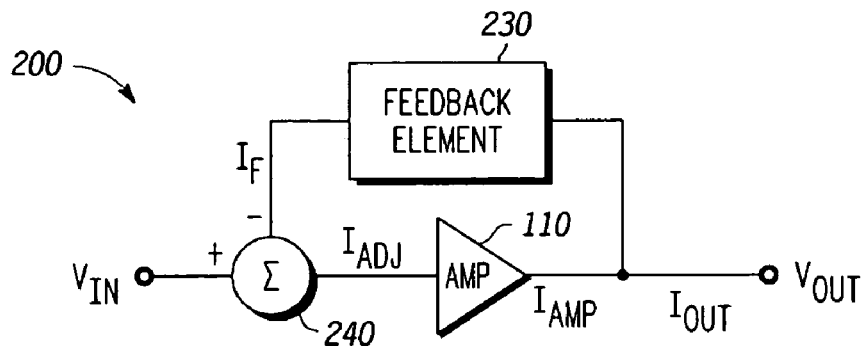
FIG. 2 is a block diagram of an amplifier feedback network without an assist current source.
Figure 3:
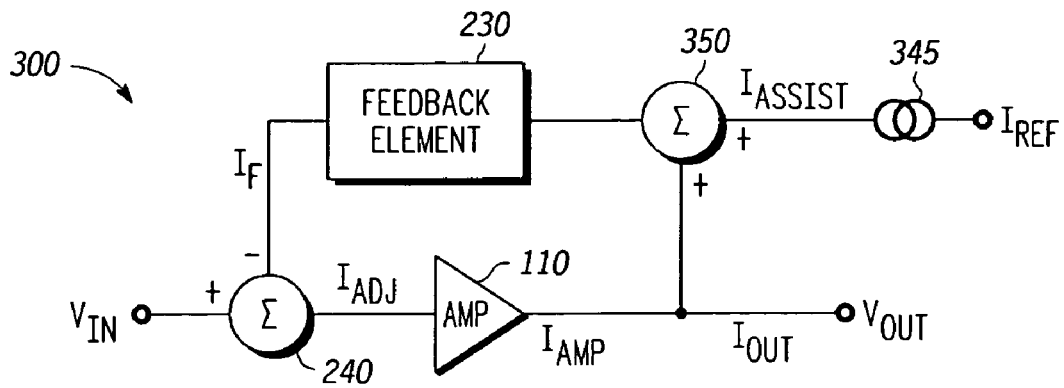
FIG. 3 is a block diagram of an amplifier feedback network with an assist current source, according to a first disclosed embodiment.
Figure 4:
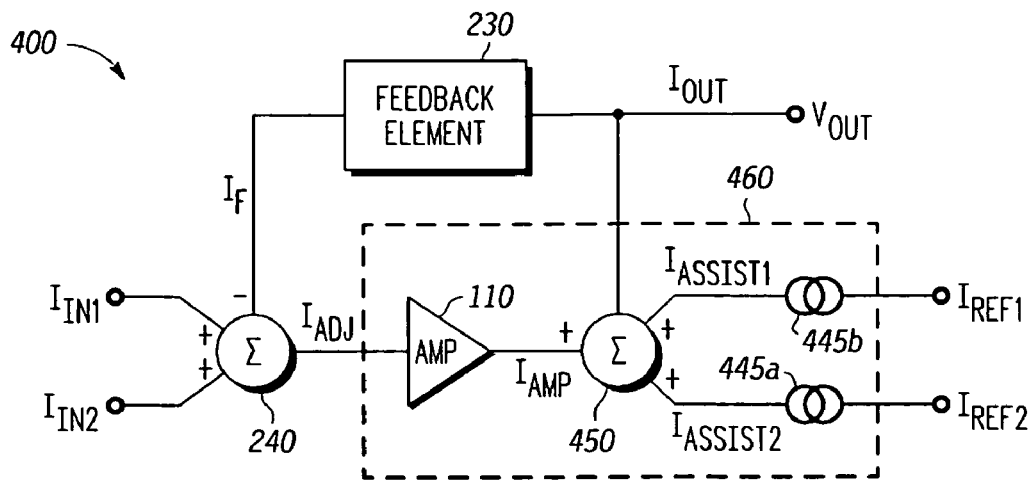
FIG. 4 is a block diagram of an amplifier feedback network with an assist current source, according to a second disclosed embodiment.

Although a specific active-RC integrator 100 is shown in FIG. 1, FIGS. 2 to 4 show more generic amplifier feedback networks. These networks can be provided with an assist current source at their output, as shown in FIGS. 3 and 4, or can be provided with no assist current source at their output, as shown in FIG. 2.

Amplifier Feedback Network Without Output Current Source

FIG. 2 is a block diagram of an amplifier feedback network without an assist current source. As shown in FIG. 2, the amplifier feedback network 200 includes an amplifier element 110, a feedback element 230, and a signal summing element 240.

The amplifier element 110 serves to amplify an input signal received at its input node in accordance with a gain value of the amplifier, to generate an output signal at its output node. The amplifier element 110 could be an operational amplifier or any other suitable amplifier circuit. The amplifier element 110 could be any variety, e.g., voltage, current, transconductance, or transresistance, depending upon the needs of the circuit it is used in. Furthermore, the amplifier could be single-ended or differential.

The feedback element 230 can be any appropriate circuit element used to provide a desired level and type of feedback. In one disclosed embodiment the feedback element 230 is a capacitor connected between the amplifier input and the amplifier output. In alternate embodiments the feedback element 230 can be a capacitor and resistor connected in parallel between the amplifier input and the amplifier output; a variety of capacitors and resistors connected in series or in parallel between the amplifier input and the amplifier output; a variety of capacitors and resistors connected between the amplifier input, the amplifier output, and a feedback voltage; etc.

The signal summing element 240 acts to combine the feedback signal ($I_F$) with the input signal ($I_{IN}$) to create an adjusted input current $I_{ADJ}$ as the input signal for the amplifier 110. In its simplest embodiment, the signal summing element could be a simple connection of both the input signal and the feedback signal to the input or inputs of the amplifier element 110. In other embodiments, the signal summing element could be any other suitable circuit element that properly combined the input signal and the feedback signal (e.g., a summer circuit).

In the disclosed embodiment, negative feedback is used, so the signal summing element 240 operates to subtract the feedback signal $I_F$ from the input signal $I_{IN}$. In alternate embodiments of feedback networks, positive feedback could be used. In this case, the signal summing element 240 would add the feedback signal to the input signal to generate the adjusted signal $I_{ADJ}$.

Although FIG. 2 shows an input current $I_{IN}$ being provided to the signal summing element 240, this current could be generated by providing an input voltage $V_{IN}$ to an input resistor (not shown) to convert the input voltage $V_{IN}$ to the input current $I_{IN}$.

Because the amplifier feedback network 200 of FIG. 2 has no output current source, the entirety of the feedback current $I_F$ must be provided at the output node of the amplifier element 110, and so must be generated by the amplifier element 110.

And as noted above, if the amplifier element 110 is a transconductance amplifier, the feedback current $I_F$ must approximately match the input current $I_{IN}$, to make the adjusted current $I_{ADJ}$ approach zero. (In this case, the adjusted current $I_{ADJ}$ combined with the input impedance of the amplifier element 110 provides the required input voltage required for a transconductance amplifier.) Thus, as the input current $I_{IN}$ rises, the transconductance $G_M$ of the amplifier element 110 must also rise, to allow the amplifier element 110 to generate sufficient output current $I_{OUT}$ to provide an adequate feedback current $I_F$.

Amplifier Feedback Network With Assist Current Source

FIG. 3 is a block diagram of an amplifier feedback network with an assist current source, according to a first disclosed embodiment. As shown in FIG. 3, the amplifier feedback network 300 includes an amplifier element 110, a feedback element 230, first and second signal summing elements 240 and 345, and an assist current source 350.

The amplifier element 110 serves to amplify an input signal received at its input node in accordance with a gain value of the amplifier element 110 to generate an output signal at its output node. In the disclosed embodiment, the amplifier element 110 is a transconductance amplifier that amplifies an amplifier input voltage generated based on an adjusted input current $I_{ADJ}$ received at its input node and the input impedance of the amplifier element 110. The amplifier element 110 performs the amplification process in accordance with a gain value (i.e., a transconductance $G_M$) of the amplifier element 110 to generate an output current $I_{OUT}$ at its output node. Different amounts of amplification can be provided in different embodiments, including no amplification.

As with the amplifier feedback network 200 of FIG. 2, the amplifier element 110 could be an operational amplifier or any other suitable amplifier circuit; and the amplifier element 110 could be single-ended or differential.

Although the amplifier element 110 of FIG. 3 is a transconductance amplifier, in alternate embodiments it could be another type of amplifier (e.g. voltage, current, or transresistance). Minor modifications may be necessary to the circuit of FIG. 3 to account for the different types of amplifier that could be implemented, as would be understood to one skilled in the art.

In one embodiment, the input current $I_{IN}$ provided to the first signal summing element 240 may be generated by providing an input voltage $V_{IN}$ to an input resistor (not shown) to convert the input voltage $V_{IN}$ to the input current $I_{IN}$. In alternate embodiments other methods of generating the input current $I_{IN}$ can be used.

The feedback element 230 provides feedback from an output node of the amplifier 110 to an input node of the amplifier element 110 in the form of a feedback current $I_F$. It can be any appropriate circuit element used to provide a desired level and sort of feedback, as noted above with respect to the amplifier feedback network 200 of FIG. 2.

The first signal summing element 240 acts to combine the feedback current $I_F$ with the input current $I_{IN}$ to create the adjusted input current $I_{ADJ}$. As with the amplifier feedback network 200 of FIG. 2, the signal summing element 240 could be a simple connection of both the input signal and the feedback signal to the input or inputs of the amplifier element 110, or could be a more elaborate circuit. Also, while negative feedback is disclosed in FIG. 3, positive feedback could also be used.

The second signal summing element 245 acts to provide the assist current $I_{ASSIST}$ to the output node of the amplifier 110. The second signal summing element 245 could be a simple connection of the assist current signal to the output of the amplifier element 110, or could be a more elaborate circuit.

The assist current source 350 is connected between the second summing element 245 and a reference current $I_{REF}$, and operates to generate an assist current $I_{ASSIST}$ that provides some or all of the required output current of the amplifier element 110 external to the circuitry of the amplifier element 110. In one embodiment, the assist current source 350 is a current-controlled current source, such as a current conveyor. In alternate embodiments, other types of current sources can be used.

In one disclosed embodiment, the reference voltage $V_{REF}$ can be selected to be equal to an input voltage $V_{IN}$, used to generate the input current $I_{IN}$, and the properties of the assist current source can be chosen such that the assist current $I_{ASSIST}$ generated by the assist current source is substantially equal to the input current $I_{IN}$. In alternate embodiments a different reference voltage $V_{REF}$ can be chosen.

As noted above, the feedback current $I_F$ must be of a sufficient size that it will, when combined with the input current $I_{IN}$, cause the first signal summing element 240 to generate an adjusted current $I_{ADJ}$ that is close to zero. However, unlike the embodiment of FIG. 2, the amplifier element 110 of FIG. 3 does not need to provide an amplifier current $I_{AMP}$ equal to or greater than the required feedback current $I_F$. In fact, if the assist current $I_{ASSIST}$ is close in value to the input current $I_{IN}$, then the amplifier current $I_{AMP}$ provided by the amplifier element 110 can be much smaller as compared with the circuit of FIG. 2.

FIG. 4 is a block diagram of an amplifier feedback network with an output current source, according to a second disclosed embodiment of the present invention. As shown in FIG. 4, the feedback network 400 includes an amplifier element 110, a feedback element 230, a signal summing element 240, and first and second assist current sources 450 and 455. In this embodiment the first and second current sources 450 and 455 are formed to be a part of a greater amplifier circuit 460.

The amplifier element 110 serves to amplify an input signal received at its input node in accordance with a gain value of the amplifier element 110 to generate an output signal at its output node. In the disclosed embodiment, the amplifier element 110 is a transconductance amplifier that amplifies an amplifier input voltage in accordance with a gain value (i.e., a transconductance $G_M$) of the amplifier element 110 to generate an output current $I_{OUT}$. This output current can then be used to generate an output voltage $V_{OUT}$. The amplifier input voltage is generated by passing an adjusted input current $I_{ADJ}$ received at its input node over the input impedance of the amplifier element 110. Different amounts of amplification can be provided in different embodiments, including no amplification.

As with the amplifier feedback network 200 of FIG. 2, the amplifier element 110 could be an operational amplifier or any other suitable amplifier circuit; further, the amplifier element 110 could be single-ended or differential.

Although the amplifier element 110 of FIG. 4 as a transconductance amplifier, it could be another type of amplifier (e.g. voltage, current, or transresistance) in alternate embodiments. Minor modifications may be necessary to the circuit of FIG. 4 to account for the different types of amplifier that could be implemented, as would be understood to one skilled in the art.

In one embodiment, the input currents $I_{IN1}$ and $I_{IN2}$ provided to the first signal summing element 240 may be generated by providing respective input voltages $V_{IN1}$ and $V_{IN2}$ to input resistors (not shown) to convert the input voltages $V_{IN1}$ and $V_{IN2}$ to the input currents $I_{IN1}$ and $I_{IN2}$. In alternate embodiments other methods of generating the input currents $I_{IN1}$ and $I_{IN2}$ can be used.

The feedback element 230 provides feedback from an output node of the amplifier 110 to an input node of the amplifier element 110 in the form of a feedback current $I_F$. It can be any appropriate circuit element used to provide a desired level and sort of feedback, as noted above with respect to the amplifier feedback network 200 of FIG. 2. This includes an embodiment in which no feedback is provided.

The signal summing element 240 acts to combine the feedback current $I_F$ with the input currents $I_{IN1}$ and $I_{IN2}$ to create the adjusted input current $I_{ADJ}$. And although two input currents $I_{IN1}$ and $I_{IN2}$ are shown in FIG. 4, this is by way of example only. Alternate embodiments could use different numbers of separate input currents.

As with the amplifier feedback network 200 of FIG. 2, the signal summing element 240 could be a simple connection of both the input signals and the feedback signal to the input or inputs of the amplifier element 110, or could be a more elaborate circuit. Also, while negative feedback is disclosed in FIG. 4, positive feedback could also be used.

The assist current sources 450 and 455 are connected between the output node of the amplifier 110 and first and second reference currents $I_{REF1}$ and $I_{REF2}$, and operate to generate first and second assist currents $I_{ASSIST1}$ and $I_{ASSIST2}$ that provide some or all of the required amplifier output current $I_{AMP}$ of the amplifier element 110 external to the circuitry of the amplifier 110 (e.g., the portion of the amplifier output current $I_{AMP}$ that would be required to provide the feedback current $I_F$).

In the embodiment of FIG. 4, the assist current sources 450 and 455 are formed in a greater amplifier circuit 460, along with the amplifier element 110. The assist current sources 450 and 455 are still separate from the circuitry of the circuitry of the amplifier 110, and thus would not affect its transconductance $G_M$. However, the three circuit elements 110, 450, and 455 can be formed within the same integrated circuit.

In the embodiments shown in FIGS. 3 and 4, the output current sources 350, 450, and 455 do not interfere with the passage of the output current $I_{OUT}$ from the output node of the amplifier 110 to an output connection, but simply provides the assist currents $I_{ASSIST}$, $I_{ASSIST1}$, and $I_{ASSIST2}$ at the output node of the amplifier element 110.

In some embodiments, the assist current $I_{ASSIST}$ is a replica current of the input current $I_{IN}$, i.e., $$I_{ASSIST} = I_{IN}. \quad (5)$$

In alternate embodiments, however, the assist current $I_{ASSIST}$ can be higher or lower than the input current $I_{IN}$. As noted in claim 4, the total assist current $I_{ASSIST}$ can be provided by multiple assist current sources. And although two are shown in FIG. 4 by way of example, more could be used in alternate embodiments.

Because the output current source 350, 450 provides some or all of the output current required for the output voltage $V_{OUT}$, the circuitry of the amplifier element 110 does not need to provide it. This will allow the amplifier element 110 to either focus its current to other tasks (e.g., settling a switched capacitor integration) or simply provide less current.

In alternate embodiments, the feedback circuits 300 and 400 can be generalized to apply to arbitrary feedback transfer functions, as well as arbitrary amplifier transfer functions (including a zero gain amplifier). In addition, although the embodiments of FIGS. 3 and 4 show that feedback is provided directly from the output of the amplifier element 110 to the input of the amplifier element 110, in alternate embodiments the feedback can come from a different place along the signal path. However. In other words, there can be intervening circuitry between the output of the amplifier element 110 and the point at which a signal is fed back to the input of the amplifier element 110.

A method of operating a feedback network is as follows. This method includes: combining a feedback signal from an incoming signal to generate an amplifier input signal at an input node of an amplifier element; amplifying the amplifier input signal in the amplifier element to produce an amplifier output signal at an output node of the amplifier element; processing the amplifier output signal according to a feedback operation to generate the feedback signal; and providing an assist current to the output node of the amplifier element, separate from an output current provided by the amplifier element.

The assist current may be a replica current approximately equal to an incoming current of the incoming signal, and the amplification operation may be a transconductance amplification operation. During the combining operation the feedback signal may be either added to the incoming signal or subtracted from the incoming signal.

The incoming signal and the amplifier output signal may both be differential signals. The assist current may be controlled by an external current. The method may be implemented in an integrated circuit. The incoming signal may be one of a radio frequency signal, an audio data signal, and a power amplifier control loop signal Also, the feedback network shown in FIGS. 3 and 4 includes: a feedback summing element that combines a feedback signal with an incoming signal to generate an amplifier input signal; an amplifier element that amplifies the amplifier input signal to generate an amplifier output signal at an amplifier output node; a feedback element that performs a feedback operation on the amplifier output signal to produce the feedback signal; and a current source that provides an assist current to the amplifier output node.

The amplifier may be a transconductance amplifier. The assist current may be a replica current that is approximately equal to an incoming current of the incoming signal. The current source may be a current-controlled current source. More specifically, the current source may be or includes a current conveyor. The current source may be formed on the same integrated circuit as the amplifier element. The feedback network may perform an active-RC integration process. The feedback element may comprise a switched capacitor element. The feedback network may be implemented in an integrated circuit.

Although FIG. 3 shows an embodiment with a single input signal $I_{IN}$ and a single assist current source 350, and FIG. 4 shows an embodiment with two input signals $I_{IN1}$ and $I_{IN2}$, and a two assist current sources 450 and 455, alternate embodiments could vary the number of input signals and assist current sources. And the two need not be the same. For example three input signals could be used with only a single assist current generator. Various possible combinations will be apparent to those skilled in the art.

Transconductance and SNDR

As noted above, because the transconductance $G_M$ of an amplifier is connected to the current it must pass, providing an assist current $I_{ASSIST}$ at the output of an amplifier can significantly reduce the amount of output current the amplifier must provide, and thus reduce the amplifier's required transconductance $G_M$, as compared to a similar circuit without the assist current $I_{ASSIST}$.

Figure 5:
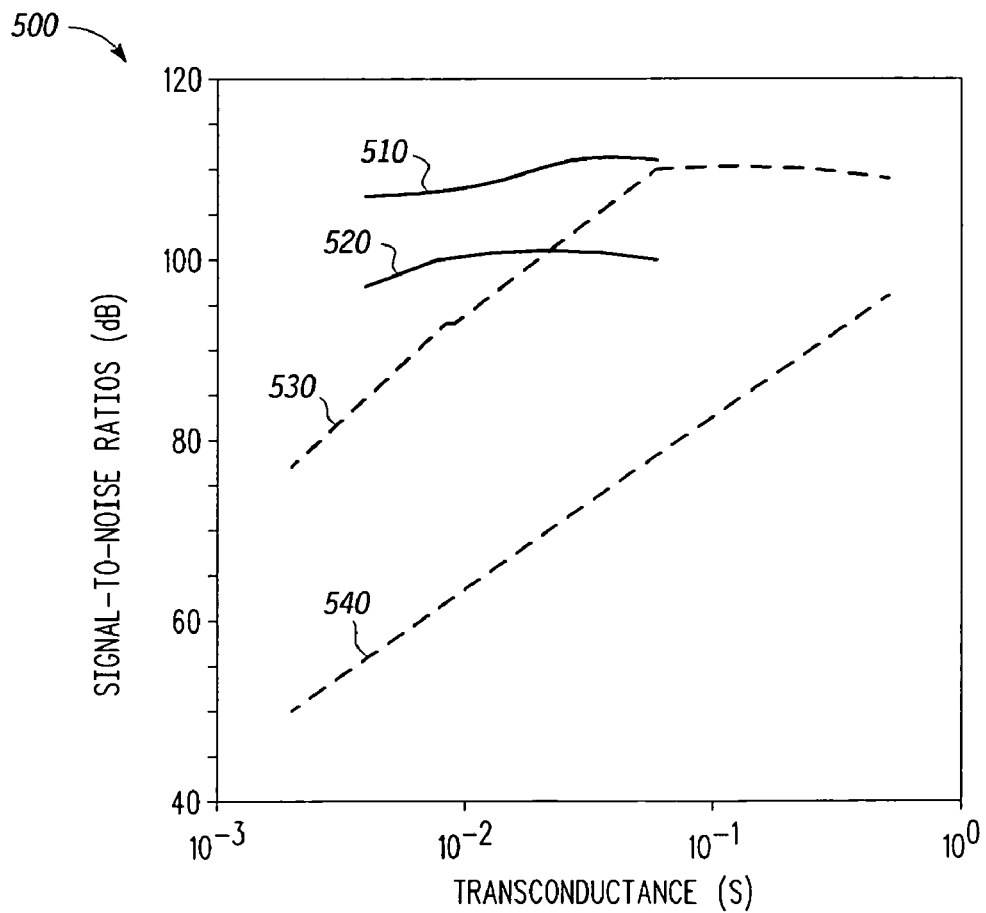
FIG. 5 is a graph of SNR and SNDR versus transconductance for feedback networks with and without assist current sources.

FIG. 5 is a graph of signal-to-noise ratio (SNR) and signal-to-noise-and-distortion ratio (SNDR) versus transconductance for feedback networks with and without external current sources. In particular, FIG. 5 shows the SNR 510 and SNRD 520 of a feedback network with an output assist current (i.e., as shown in FIG. 2), and the SNR 530 and SNRD 540 of a feedback network without an output assist current (i.e., as shown in FIG. 3).

As shown in FIG. 5, the SNR 510 and SNRD 520 of the feedback network with an output assist current remains relatively constant over a wide range of transconductance $G_M$, while the SNR 530 and SNRD 540 of the feedback network without an output assist current drops sharply as the transconductance $G_M$ drops.

As a result, for a feedback network without an output assist current to obtain a desired SNR or SNDR, a relatively high transconductance $G_M$ is required. And as the desired SNR or SNDR rises, the required transconductance $G_M$ rises in a similar manner.

However, when the output assist current is added, the SNR and SNDR remain nearly constant over a large range of transconductance $G_M$. This means that a much lower transconductance $G_M$ can be used without a significant loss of SNR or SNDR, which corresponds to a cheaper and smaller circuit design.

Feedback Network with Assist Current Source and Switched Capacitors

In some circuits it can be desirable to have both switched-capacitor feedback and active RC-integration. Switched-capacitor feedback gives the good jitter immunity of a switched-capacitor architecture, while active-RC integration enables simultaneous integration of the switched-capacitor feedback and a continuous-time input.

Figure 6:
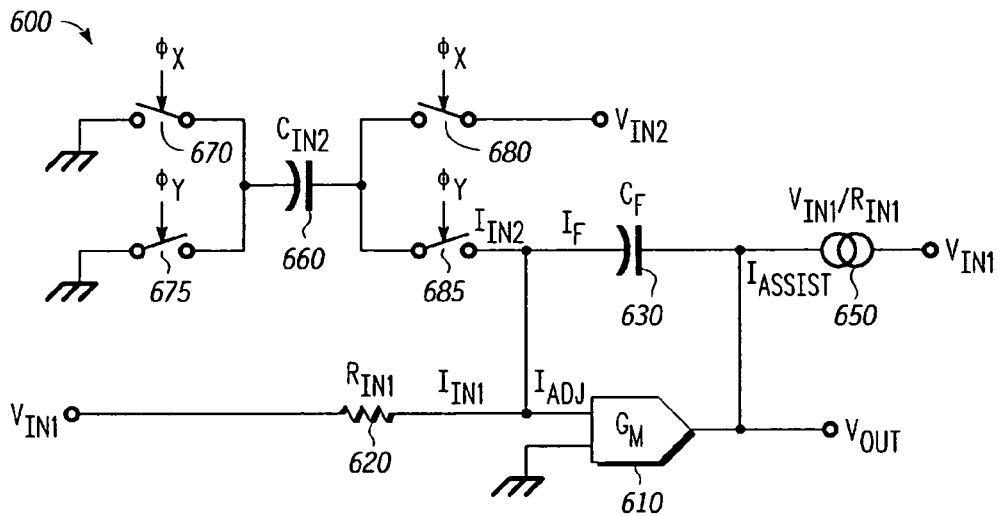
FIG. 6 is a circuit diagram of a single-ended amplifier feedback network according to a disclosed embodiment.

FIG. 6 is a circuit diagram of a single-ended amplifier feedback network according to a disclosed embodiment of the present invention. This feedback network employs both active-RC integration and switched-capacitor feedback. As shown in FIG. 6, the amplifier feedback network 600 includes an amplifier 610, an input resistor 620, a feedback capacitor 630, an assist current source 650, a switched capacitor 660, and first through fourth switches 670, 675, 680, and 685. This amplifier feedback network 600 is an integrator used in a sigma-delta modulator.

The amplifier 610 is a transconductance amplifier serves to amplify an amplifier input voltage received at its input node in accordance with a gain value (i.e., a transconductance $G_M$) of the amplifier 610 to generate an output current $I_{OUT}$. This can, however, include embodiments in which no amplification is provided, and the amplifier 610 could be an operational amplifier or any other suitable amplifier circuit; and the amplifier 610 could be single-ended or differential.

The input resistor 620 takes a first input voltage $V_{IN1}$ and converts it into a first input current $I_{IN1}$. In alternate embodiments, other circuits can be used to provide the first input current $I_{IN1}$ to the amplifier 610.

The feedback capacitor 630 provides feedback current $I_F$ at the input of the amplifier 610 by passing the output voltage $V_{OUT}$ from an output node of the amplifier 610 to an input node of the amplifier 610 through the feedback capacitor 630. The parameters of the feedback capacitor 630 can be chosen to provide the desired level of feedback. In alternate embodiments, other sorts of feedback elements could be used.

The assist current source 650 is connected to the output node of the amplifier 610 and operates to generate an assist current $I_{ASSIST}$ that provides some or all of the required output current external to the circuitry of the amplifier 610. In the embodiment disclosed in FIG. 6, the assist current $I_{ASSIST}$ is equal to a replica current of the input current $I_{IN}$ (i.e., $V_{IN}/R_{IN}$). In alternate embodiments, however, the magnitude of the assist current $I_{ASSIST}$ can be altered as needed. One exemplary embodiment of the assist current source 650 would be a single-ended version of the current source 755 from FIG. 8 below.

The first through fourth switches 670, 675, 680, and 685 operate to connect the switched capacitor 660 alternately between an input of the amplifier 610 and ground and a second input voltage $V_{IN2}$ and ground to provide a second input current $I_{IN2}$. In some embodiments the second input voltage $V_{IN2}$ could be from a point is the signal stream from which feedback was desired. In this way, the second input current could be an alternate feedback current.

The first and third switches 670 and 680 operate according to a first clock $\phi_X$, and the second and fourth switches 675 and 685 operate according to a second clock $\phi_Y$. In the embodiment of FIG. 6, the second clock $\phi_Y$ is non-overlapping with the first clock $\phi_X$. The switched capacitor 660 and the first through fourth switches 670 to 685 perform a switched-capacitor integration function.

In the integrator of FIG. 6, the first input voltage $V_{IN1}$ varies slowly. As a result, it is possible to replicate the first input current $I_{IN1}$ (i.e., $V_{IN1}/R_{IN1}$) at the assist current source 650 with a low performance amplifier. This could be done simply by having the input voltage also connected to the assist current source 650 and providing the assist current source 650 with a resistor the same size as the input resistor 620. By matching the first input current $I_{IN1}$ at the output $V_{OUT}$ of the amplifier 610 with appropriate polarity, the input of the amplifier 610 need only support a much smaller voltage, thus allowing the switched-capacitor portion of the circuit 600 to settle to higher accuracy. This can potentially reduce the required transconductance $G_M$ by an order of magnitude.

Switched Capacitor Differential Feedback Network with Assist Current Source

Figure 7:
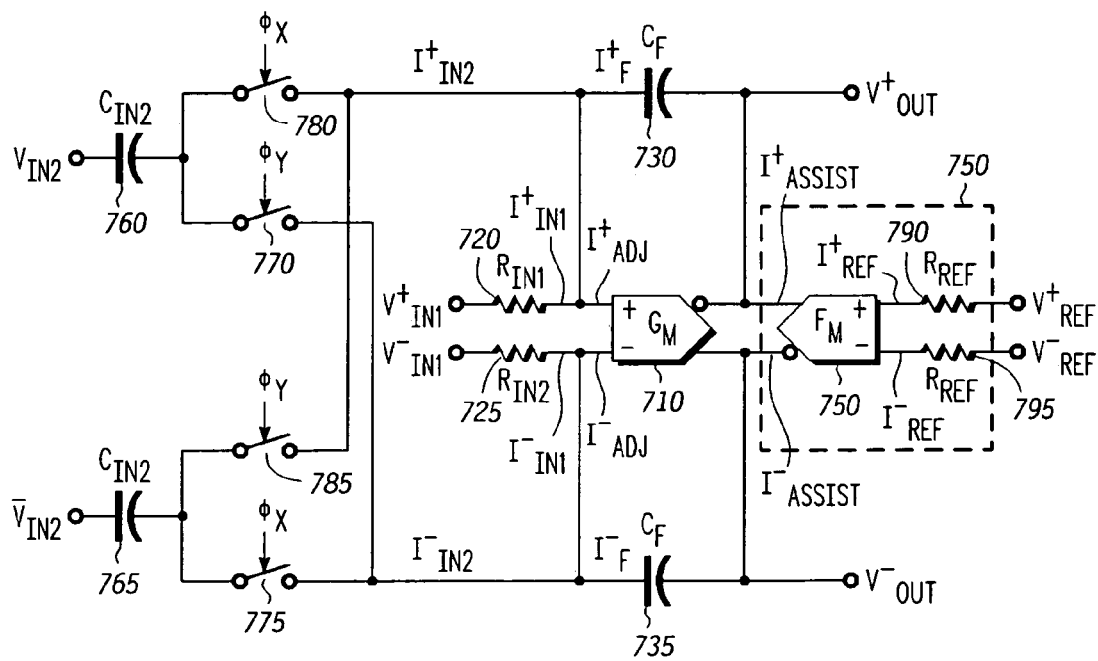
FIG. 7 is a circuit diagram of a differential amplifier feedback network according to a disclosed embodiment.

As noted above, the feedback networks of the present invention can be either single-ended or differential. FIG. 7 is a circuit diagram of a differential amplifier feedback network according to a disclosed embodiment of the present invention. As shown in FIG. 7, the feedback network 700 includes a transconductance amplifier 710, first and second input resistors 720 and 725, first and second feedback capacitors 730 and 735, a differential assist current source 750, first and second switched capacitors 760 and 765, first through fourth switches 770, 775, 780, and 785, and first and second assist resistors 790 and 795.

The transconductance amplifier 710 serves to amplify a differential adjusted input current ($I_{ADJ}^+/I_{ADJ}^-$) received at its input node in accordance with a gain value (i.e., a transconductance $G_M$) of the amplifier 710 to generate a differential output voltage ($V_{OUT}^+/V_{OUT}^-$). This can, however, include embodiments in which no amplification is provided, and the amplifier 710 could be an operational amplifier or any other suitable amplifier.

The first and second input resistors 720 and 725 take a first differential input voltage ($V_{IN1}^+/V_{IN1}^-$) and converts it into a first differential amplifier input current ($I_{IN1}^+/I_{IN1}^-$). In alternate embodiments, other circuits can be used to provide differential amplifier input current to the amplifier 710.

The first and second feedback capacitors 730 and 735 provide feedback signals ($I_F^+/I_F^-$) from differential output nodes of the amplifier 710 to differential input nodes of the amplifier 710. The parameters of the feedback capacitors 730 and 735 can be chosen to provide the desired level of feedback. In addition, in alternate embodiments, different feedback circuits could be used.

The first through fourth switches 770, 775, 780, and 785 operate to connect the switched capacitors 760 and 765 alternately between a respective differential input of the amplifier 710 and non-overlapping second input voltages ($V_{IN2}^+/V_{IN2}^-$) to provide a second differential amplifier input current ($I_{IN2}^+/I_{IN2}^-$). The second and third switches 675 and 680 operate according to a first clock $\phi_X$, and the first and fourth switches 670 and 680 operate according to a second clock $\phi_Y$. In the embodiment of FIG. 7, the second clock $\phi_Y$ is non-overlapping with respect to the first clock $\phi_X$. The feedback capacitors 760 and 765, and the first through fourth switches 770 to 785 perform a switched-capacitor integration function.

The differential assist current source 750 is connected to the differential output nodes of the amplifier 710 and operates to generate a differential assist current ($I_{ASSIST}^+/I_{ASSIST}^-$) that provides some or all of the required output current external to the circuitry of the amplifier 110. The differential assist current source 750 includes a current-controlled differential current source 755 and first and second assist resistors 790 and 795.

The first and second assist resistors 790 and 795 take the differential amplifier input voltage ($V_{REF}^+/V_{REF}^-$) and convert it into the differential assist control current ($I_{REF}^+/I_{REF}^-$) that it provided to the current-controlled differential current source 755 to generate the differential assist current ($I_{ASSIST}^+/I_{ASSIST}^-$). In alternate embodiments, other circuits can be used to provide differential amplifier assist control current to the amplifier 710.

In the embodiment disclosed in FIG. 7, first and second assist resistors 790 and 795 are of the same value as the first and second input resistors 230 and 235, and they receive the differential amplifier input voltage ($V_{IN1}^+/V_{IN1}^-$). As a result, the differential assist current ($I_{ASSIST}^+/I_{ASSIST}^-$) is equal to a replica current of the differential amplifier input current ($I_{IN1}^+/I_{IN1}^-$). In alternate embodiments, however, the magnitude of the differential assist current ($I_{ASSIST}^+/I_{ASSIST}^-$) can be altered as needed.

For active-RC integration, and without the assist current being provided, the differential voltage at the input of the amplifier 710 should be approximately equal to $$V_{AMP} \approx \frac{V_{IN}/R_{IN}}{G_M}. \quad (6)$$

However, $V_{AMP}$ can be a large or small voltage.

Likewise, for switched-capacitor integration, voltage at the input of the amplifier 710 must settle to less than $V_{IN} \cdot 10^{-SNR/20}$, where SNR is equal to the original charge in the feedback capacitor prior to integration, divided by the residual charge left in the feedback capacitor after integration (in dB).

However, with assisted feedback, the active-RC integration limitation on the input voltage $V_{AMP}$ of the amplifier 710 is no longer required, since the current that would ordinarily be supplied by the amplifier 710 is now supplied (at least in part) by the assist current source 750 instead. In some embodiments this can reduce the required transconductance $G_M$ of the amplifier 710 by a factor of twelve.

Thus, because the assist current source 750 provides the assist current at the output of the amplifier 710, the switched-capacitor integration portion of the feedback circuit 700 and the active-RC integration portion of the feedback circuit 700 simultaneously coexist with each other without undue burden on the amplifier 710. In particular, because there is no excessive demand for output current, the amplifier 710 can maintain a low transconductance $G_m$ without failing to support either the switched-capacitor integration portion or the active-RC integration portion of the feedback circuit 700.

The feedback network shown in FIG. 7 includes a first feedback summing element that combines a first feedback signal with a first incoming differential signal to generate a first amplifier differential input signal; a second feedback summing element that combines a second feedback signal with a second incoming differential signal to generate a second amplifier differential input signal; an amplifier circuit that amplifies the first and second amplifier differential input signals to generate first and second amplifier differential output signals at first and second amplifier output nodes; a first feedback element that performs a first feedback operation on the first amplifier differential output signal to produce the first feedback signal; a second feedback element that performs a second feedback operation on the second amplifier differential output signal to produce the second feedback signal; and a differential current source that provides first and second differential assist currents at the first and second amplifier output nodes, respectively.

The amplifier circuit may be a differential transconductance amplifier, and the current source may be a current-controlled current source. The feedback network performs an active-RC integration process, and the first and second feedback elements may each comprise a switched capacitor element.

Current Source

Figure 8:
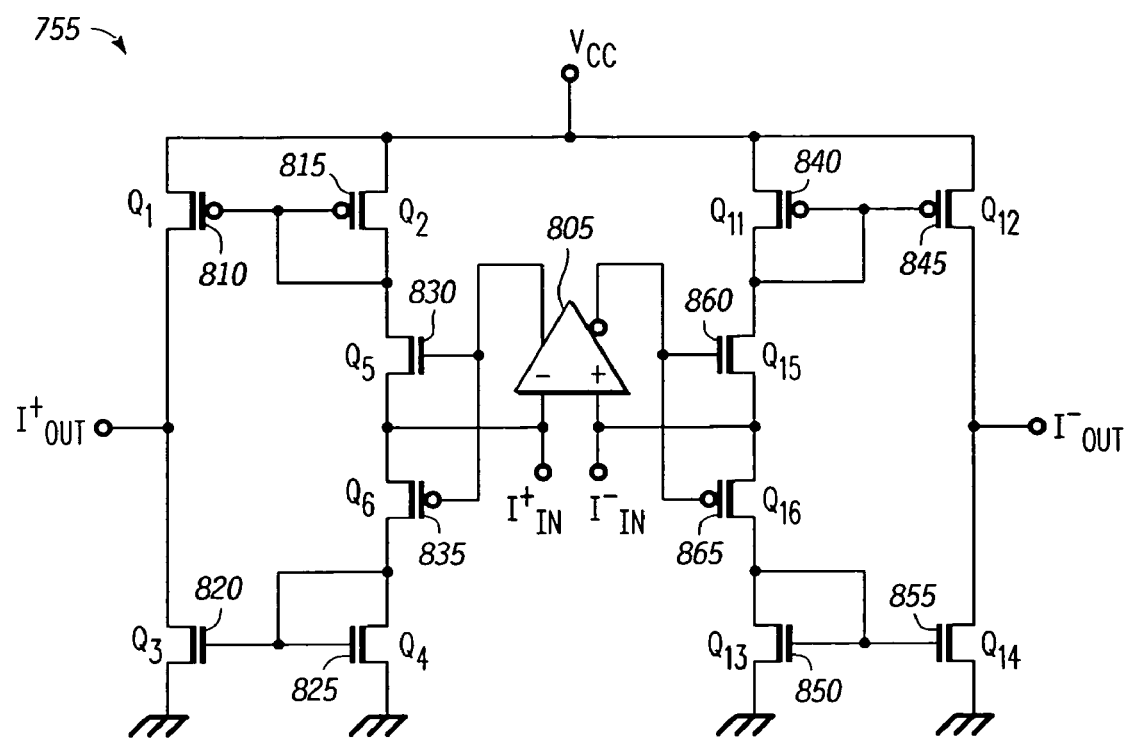
FIG. 8 is a circuit diagram of a differential current source according to a disclosed embodiment.

FIG. 8 is a circuit diagram of a differential current source 755 according to a disclosed embodiment of the present invention. A single-ended version of this current source 755 could be used as the current source 350, 450, or 650 from FIG. 3, 4, or 6. As shown in FIG. 8, the differential current source 755 includes a differential amplifier 805 and first through twelfth transistors 810, 815, 820, 825, 830, 835, 840, 845, 850, 855, 860, and 865, connected to form a current conveyor.

The current conveyor 755 receives a differential input current $I_{IN}^+/I_{IN}^-$ at the input of the differential amplifier 805 and provides a differential output current $I_{OUT}^+/I_{OUT}^-$. The first through twelfth transistors 810 to 865 are arranged as a plurality of current mirrors. Thus, the current conveyor 755 of FIG. 8 is essentially a current-controlled current source. Current gain is used to reduce power consumption. In alternate embodiments, however, a voltage-controlled current source could be provided.

Although the current source 755 of FIG. 8 is a differential current source, in alternate embodiments it could be a single-ended current source when a single-ended amplifier is used.

CONCLUSION

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled. The various circuits described above can be implemented in discrete circuits or integrated circuits, as desired by implementation.

What is claimed is:

1. A method of operating a feedback network, comprising:
combining a feedback signal from an incoming signal to generate an amplifier input signal at an input node of an amplifier element;
amplifying the amplifier input signal in the amplifier element to produce an amplifier output signal at an output node of the amplifier element;
processing the amplifier output signal according to a feedback operation to generate the feedback signal; and
providing an assist current to the output node of the amplifier element, separate from an output current provided by the amplifier element.

2. A method of operating a feedback network, as recited in claim 1, wherein the assist current is a replica current approximately equal to an incoming current of the incoming signal.

3. A method of operating a feedback network, as recited in claim 1, wherein the amplification operation is a transconductance amplification operation.

4. A method of operating a feedback network, as recited in claim 1, wherein during the combining operation, the feedback signal is either added to the incoming signal or subtracted from the incoming signal.

5. A method of operating a feedback network, as recited in claim 1, wherein the incoming signal and the amplifier output signal one of both single-ended signals, and both differential signals.

6. A method of operating a feedback network, as recited in claim 1, wherein the method is implemented in an integrated circuit.

7. A feedback network, comprising:
a feedback summing element that combines a feedback signal with an incoming signal to generate an amplifier input signal;
an amplifier element that amplifies the amplifier input signal to generate an amplifier output signal at an amplifier output node;
a feedback element that performs a feedback operation on the amplifier output signal to produce the feedback signal; and
a current source that provides an assist current to the amplifier output node.

8. A feedback network, as recited in claim 7, wherein the amplifier element is a transconductance amplifier.

9. A feedback network, as recited in claim 7, wherein the incoming signal is one of a radio frequency signal, an audio data signal, and a power amplifier control loop signal.

10. A feedback network, as recited in claim 7, wherein the assist current is a replica current approximately equal to an incoming current of the incoming signal.

11. A feedback network, as recited in claim 7, wherein the current source is a current-controlled current source.

12. A feedback network, as recited in claim 11, wherein the current source is or includes a current conveyor.

13. A feedback network, as recited in claim 11, wherein the current source comprises an operational current amplifier.

14. A feedback network, as recited in claim 7, wherein the current source is formed on the same integrated circuit as the amplifier element.

15. A feedback network, as recited in claim 7, wherein the feedback network is implemented in an integrated circuit.

16. A feedback network, as recited in claim 7, wherein the feedback network is implemented using CMOS transistors.

17. A feedback network, as recited in claim 7,
wherein the feedback signal is a differential feedback signal, comprising a first feedback signal and a second feedback signal,
wherein the incoming signal is a differential incoming signal, comprising a first incoming signal and a second incoming signal,
wherein the amplifier input signal is a differential amplifier input signal, comprising a first amplifier input signal and a second amplifier input signal, and
wherein the feedback summing element comprises:
a first feedback summing element that combines the first feedback signal with the first incoming signal to generate the first amplifier input signal; and
a second feedback summing element that combines the second feedback signal with the second incoming signal to generate the second amplifier input signal.

18. A feedback network, as recited in claim 7,
wherein the amplifier input signal is a differential amplifier input signal, comprising a first amplifier input signal and a second amplifier input signal,
wherein the amplifier element is a differential amplifier that amplifies first and second amplifier input signals to generate first and second amplifier output signals, respectively, at first and second amplifier output nodes, and
wherein the current source provides the assist current to the first and second amplifier output nodes.

19. A feedback network, as recited in claim 18
wherein the current source is a differential current source that provides first and second assist currents to the first and second amplifier output nodes, respectively.

20. A feedback network, as recited in claim 7,
wherein the amplifier output signal is a differential output signal that comprises a first differential output signal and a second differential output signal,
wherein the feedback signal is a differential feedback signal that comprises a first feedback signal and a second feedback signal, and
wherein the feedback element is a differential feedback element that comprises:
a first feedback element that performs a first feedback operation on the first amplifier output signal to produce the first feedback signal; and
a second feedback element that performs a second feedback operation on the second amplifier output signal to produce the second feedback signal.

* * * * *